(12) United States Patent
Srivastava et al.

(10) Patent No.: US 10,613,829 B2
(45) Date of Patent: Apr. 7, 2020

(54) PERFORMANCE POWER OPTIMIZED FULL ADDER

(71) Applicant: QUALCOMM Incorporated, San Diego, CA (US)

(72) Inventors: Manish Srivastava, Bangalore (IN); Esakkimuthu Dhakshinamoorthy, Bangalore (IN); Neha Gupta, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 107 days.

(21) Appl. No.: 15/982,987

(22) Filed: May 17, 2018

(65) Prior Publication Data

US 2019/0354347 A1 Nov. 21, 2019

(51) Int. Cl.
*G06F 7/501* (2006.01)
*G06F 7/503* (2006.01)
*H02M 1/088* (2006.01)
*H03K 19/21* (2006.01)

(52) U.S. Cl.
CPC ............ *G06F 7/503* (2013.01); *G06F 7/5016* (2013.01); *H02M 1/088* (2013.01); *H03K 19/212* (2013.01)

(58) Field of Classification Search
None
See application file for complete search history.

(56) References Cited

U.S. PATENT DOCUMENTS

| | | | |
|---|---|---|---|
| 4,523,292 A * | 6/1985 | Armer | G06F 7/503 708/703 |
| 4,831,578 A | 5/1989 | Bui | |
| 5,040,139 A * | 8/1991 | Tran | G06F 7/501 708/628 |
| 5,491,653 A | 2/1996 | Taborn et al. | |
| 5,717,622 A | 2/1998 | Kawamoto et al. | |
| 5,875,124 A * | 2/1999 | Takahashi | G06F 7/501 708/702 |
| 7,475,105 B2 | 1/2009 | Minz | |
| 9,239,703 B2 | 1/2016 | Kim | |
| 2010/0277202 A1 | 11/2010 | Becker | |
| 2016/0092170 A1 | 3/2016 | Nandi et al. | |

(Continued)

FOREIGN PATENT DOCUMENTS

| CN | 103227635 A | 7/2013 |
|---|---|---|
| DE | 4342639 C1 | 4/1995 |

(Continued)

OTHER PUBLICATIONS

Partial International Search Report—PCT/US2019/020194—ISA/EPO—dated May 27, 2019.

(Continued)

*Primary Examiner* — David H Malzahn
(74) *Attorney, Agent, or Firm* — Haynes and Boone, LLP (36340)

(57) ABSTRACT

A full adder is provided in which a sum logic circuit for producing the sum signal and a carry-out logic circuit for producing the carry-out output paths do not share internal nodes. In addition, the sum logic circuit and the carry-out logic circuit are both configured to obviate the need for transmission gates with respect to forming the sum signal and the carry-out signal.

11 Claims, 5 Drawing Sheets

(56) References Cited

U.S. PATENT DOCUMENTS

2019/0354347 A1* 11/2019 Srivastava ............. H03K 19/20

FOREIGN PATENT DOCUMENTS

| KR | 20180043007 A | 4/2018 |
|----|---------------|--------|
| WO | WO 86/07173 | 12/1986 |

OTHER PUBLICATIONS

International Search Reporrt and Written Opinion—PCT/US2019/020194—ISA/EPO—dated Sep. 18, 2019.
Mastorakis N.E., et al., "High Speed Gate Level Synchronous Full Adder Designs Optimal software quality management tools design View project Supercritical Fluid Process—Solubility Thermodynamic Modeling View project High Speed Gate Level Synchronous Full Adder Designs", WSEAS Transactions on Circuits and Systems, Jan. 1, 2009 (Jan. 1, 2009),vol. 8, Issue. 2, pp. 290-300, XP055611854.
Scherz P., "Practical Electronics for Inventors", McGraw-Hill, US, Jan. 1, 2000 (Jan. 1, 2000), pp. 325-334, XP055611810, ISBN: 978-0-07-138990-7.

* cited by examiner

PERFORMANCE POWER OPTIMIZED FULL ADDER

TECHNICAL FIELD

This application relates to full adders, and more particularly a full adder optimized for low power and high density applications.

BACKGROUND

A full adder is a digital circuit that adds a pair of binary input bits and a carry-in bit to produce an output bit (the sum bit) and also a carry-out bit. In contrast, a half adder would merely add the pair of binary input bits without considering any carry-in bit. A full adder is commonly found in numerous digital circuits such as in arithmetic logic units. It is thus conventional in the design of a digital core to include numerous full adders. The power consumption, operating speed, and density of full adders is thus an important factor in the design of digital cores.

But circuit design of digital cores involves the use of a synthesis tool that converts register transfer level logic into standard cells that can then be physically arranged on a semiconductor substrate to form the desired integrated circuit. The synthesis tool must satisfy timing constraints that overwhelm other considerations such as increasing speed and reducing power consumption. The synthesis tool thus defaults to area and timing optimizations that neglect power consumption and speed goals. The resulting full adders from the synthesis tool then consume substantial power in an already thermally constrained environment. In particular, conventional full adders may include an internal circuit node that is shared by the circuit paths producing the carry-out bit and the sum bit. Such a circuit node will thus have substantial parasitic capacitance. The charging and discharging of the loaded internal circuit node then consumes power and slows operating speed. Alternatively, conventional full adders have a pair of logic gates to produce the sum signal (and another pair for producing the carry out signal). The contention between the logic gates with regard to driving the sum signal (or the carry-out signal) is solved through a corresponding pair of transmission gates controlled by the carry-in signal and its complement. But the transmission gates then introduce a struggle between their input and output that also consumes power and slows operating speed.

There is thus a need in the art for improved full adders having increased operating speed and reduced power consumption.

SUMMARY

A full adder is disclosed that includes a sum logic circuit for producing the sum signal and also includes a carry-out logic circuit for producing the carry-out signal. The sum logic circuit produces the sum signal on a first output node controlled by a single first logic gate so that there is no contention of the first output node by multiple logic gates that would require mitigation through transmission gates. Similarly, the carry-out logic circuit produces the carry-out signal on a second output node controlled by a single second logic gate so that there is no contention of the second output node by multiple logic gates that would require mitigation through transmission gates. The sum logic circuit and the carry-out logic circuit do not share internal nodes and thus have low power consumption and increased operating speed.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

A full adder is disclosed that includes a carry-out logic circuit for producing the carry-out signal and includes a sum logic circuit for producing the sum signal. The carry-out logic circuit and the sum logic circuit do not share internal circuit nodes. The internal nodes for the carry-out logic circuit and the sum logic circuit are thus not loaded with excessive parasitic capacitance, which increases operating speed and reduces power consumption. Moreover, an output node carrying the sum signal is driven by just a single logic gate within the sum logic circuit so there is no contention between multiple logic gates with regard to driving this output node. There is thus no need for transmission gates to address this missing contention so that there is no transmission-gate-produced struggle and power consumption. Similarly, an output node supporting the carry-out signal is also driven by a single logic gate within the carry-out logic circuit. Advantageously, these benefits may be achieved at the cost of a minor reduction of circuit density resulting from the sum path and carry-out path isolation. The carry-out logic circuit will be discussed first followed by a discussion of the sum logic circuit.

Figure 1:
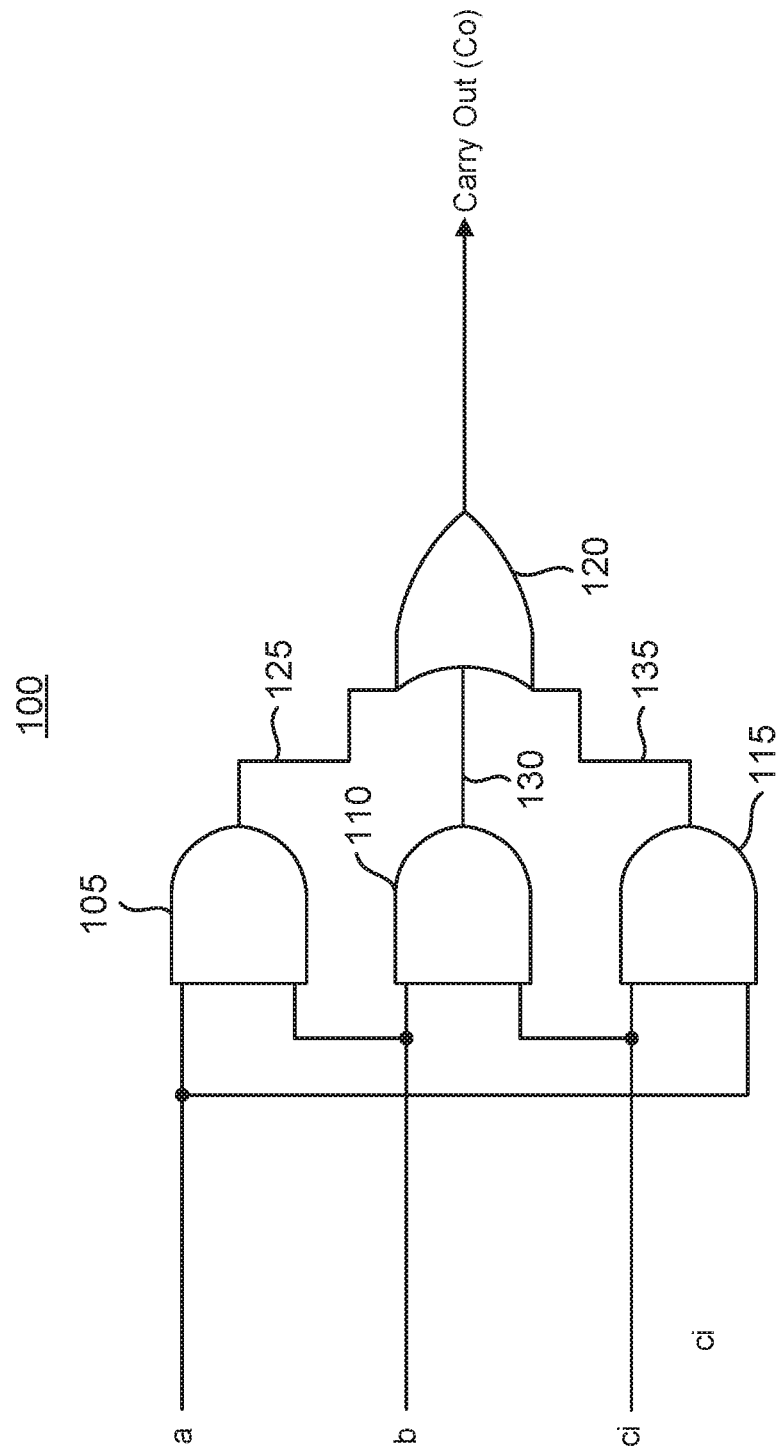
FIG. 1 is a logic-gate-level representation of a carry-out logic circuit in accordance with an aspect of the disclosure.

A carry-out logic circuit 100 for producing the carry-out signal is shown in FIG. 1 for processing a pair of binary input signals a and b with a binary carry-in (ci) signal to produce the binary carry-out (Co) signal. A first AND gate 105 ANDs the input signals a and b to produce a first AND output signal 125. Similarly, a second AND gate 110 ANDs input signal b with the carry-in signal to produce a second AND output signal 130. Finally, a third AND gate 115 ANDs input signal a and the carry-in signal to form an third AND output signal 135. An OR gate 120 ORs first AND output signal 125, second AND output signal 130, and third AND output signal 135 to form the carry-out signal.

Figure 2:
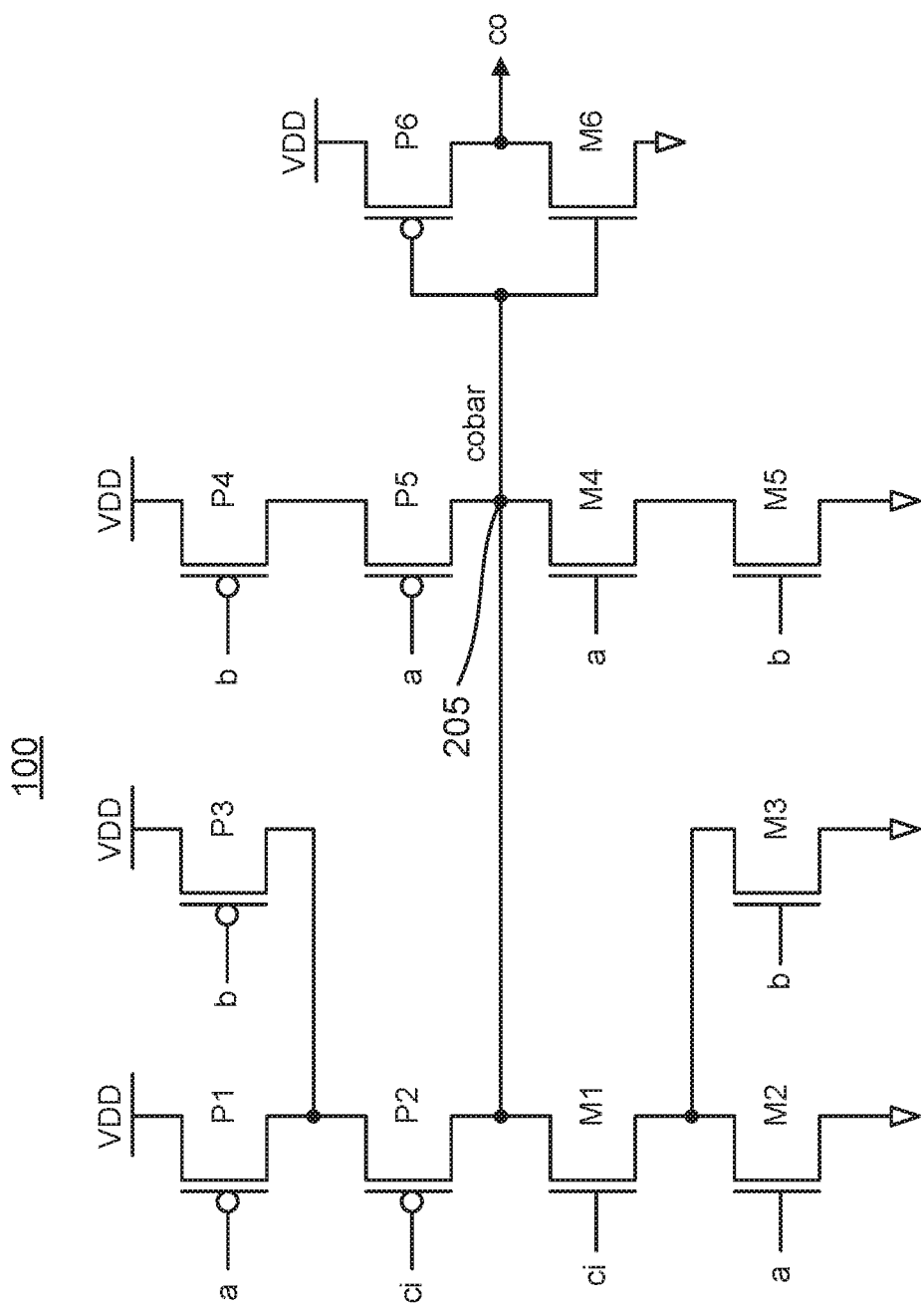
FIG. 2 is a circuit diagram of the carry-out logic circuit of FIG. 1 in accordance with an aspect of the disclosure.

The input signals a and b as well as the carry-in signal ci form a set of full-adder signals. Since there are three signals in this set of full-adder signals, there are eight different binary combinations for them. If both the input signals a and b equal a binary one value, the carry-in signal ci can be either a binary zero or a binary one. There are thus two combinations out of the eight different binary combinations for the set of full-adder signals in which the input signals a and b both equal a binary one. In both those cases, the carry-out signal should equal a binary one as well. Referring to a circuit diagram for carry-out logic circuit 100 as shown in FIG. 2, a node 205 for carrying a complement of the carry-out signal (this complement being designated as cobar) connects to ground through a serial combination of an n-type metal oxide semiconductor (NMOS) transistor M4 and an NMOS transistor M5. The input signal a drives the gate of transistor M4 whereas the input signal b drives the gate of transistor M5 but it will be appreciated that the ordering of these input signals may be reversed such that the input signal a would drive the gate of transistor M5 in alternative implementations. Regardless of the ordering of the signals, transistors M4 and M5 will both be on if the input signals a and b are both in a binary one state (in a logic high implementation). The complement carry-out signal carried on node 205 will then be grounded. An inverter formed by a p-type metal oxide semiconductor (PMOS) transistor P6 and an NMOS transistor M6 inverts the complement carry-out signal to form the carry-out signal co, which will thus be asserted high when both the input signals a and b are also asserted high. Transistors M4 and M5 may be deemed to form a switch configured to close responsive to both of the input signals a and b being asserted high.

Since the carry-in signal can be either high or low when both the input signals a and b are low, there are two binary possibilities for the set of full-adder signals when both the input signals a and b are low. The carry-out signal should be low for both these combinations. To force this low state, node 205 connects to a power supply node supplying a power supply voltage VDD through a serial combination of a PMOS transistor P5 and a PMOS transistor P4. The input signal b drives the gate of transistor P4 whereas the input signal a drives the gate of transistor P5 but it will be appreciated that input signal b may instead drive the gate of transistor P5 in alternative implementations. The complement carry-out signal will thus be charged high so that the carry-out signal co will be discharged low when both the input signals a and b are low. Transistors P4 and P5 may be deemed to form a switch configured to close responsive to both of the input signals a and b being discharged.

There are four remaining binary combinations for the set of full-adder signals. In these remaining possibilities, the input signals a and b are in complementary binary states such that one is high and the other is low. For these four binary states, the binary state of the carry-out signal matches the state of the carry-in signal so that these signals are either both high or both low. To enforce this dependence on the carry-in signal, node 205 couples to the power supply node through a PMOS transistor P2 in series with a pair of PMOS transistors P1 and P3 arranged in parallel. The carry-in signal drives the gate of transistor P2. Similarly, the input signal a drives the gate of transistor P1 whereas the input signal b drives the gate of transistor P3. The parallel arrangement of transistor P1 and P3 ensures that the complement carry-out signal will be charged high regardless of which input signal a orb is asserted low when the carry-in signal is also low. In this fashion, the carry-out signal will be asserted low when the carry-in signal is low and the input signals a and b are in complementary states. Note that the parallel arrangement of transistors P1 and P3 may instead connect to the node 205 such that transistor P2 would connect between the power supply node and transistors P1 and P3 in alternative implementations.

To ensure that the carry-out signal is charged high in response to the carry-in signal being charged high while the input signals a and b are in complementary states, node 205 couples to ground through an NMOS transistor M1 in series with a parallel arrangement of an NMOS transistor M2 and an NMOS transistor M3. The input signal a drives the gate of transistor M2 whereas the input signal b drives the gate of transistor M3. One of the transistors M2 and M3 will thus be switched on depending upon which of the input signals a and b is charged high. The carry-in signal drives the gate of transistor M1 so that transistor M1 will also be switched on when the carry-in signal is high. Node 205 will thus be discharged to ground when the carry-in signal is high and the input signals a and b are in complementary states. The carry-out signal will then also be charged high when the carry-in signal is high and the input signals a and b are in complementary states. Note that the parallel arrangement of transistors M2 and M3 may instead connect to node 205 instead of to ground. Transistor M2 would then connect between ground and the parallel arrangement of transistors M2 and M3 in such an alternative implementation.

Figure 3:
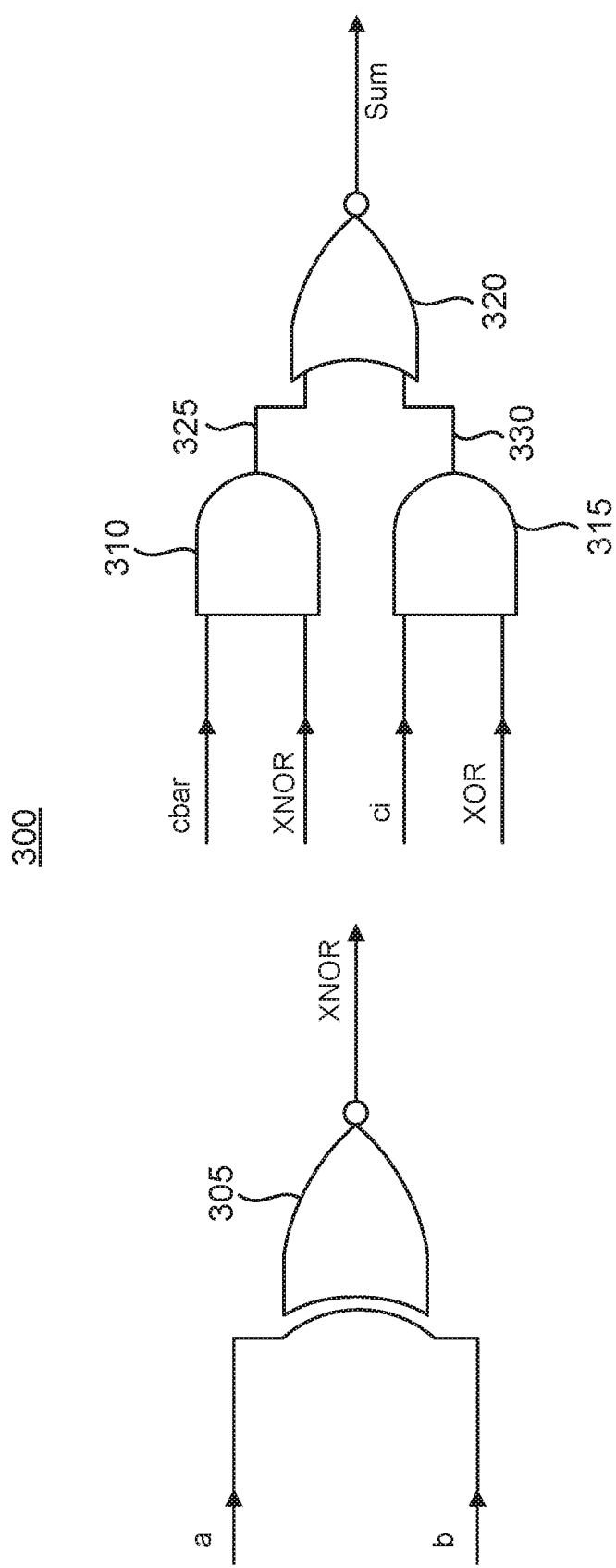
FIG. 3 is a logic-gate-level representation of a sum logic circuit in accordance with an aspect of the invention.

An example sum logic circuit 300 shown in FIG. 3 will now be discussed. Sum logic circuit 300 includes an exclusive-NOR (XNOR) gate 305 to produce an XNOR signal based upon an XNOR of the input signals a and b. An exclusive OR (XOR) of the input signals a and b is thus formed through an inversion of the XNOR signal as will be discussed further below. In addition, an inverse of the carry-in signal designated as a cbar signal is formed through an inversion of the carry-in signal as also discussed further below. To produce the sum signal, sum logic circuit 300 includes a first AND gate 310 that ANDs the cbar signal and the XNOR signal to form an output signal 325. Similarly, a second AND gate 315 ANDS the carry-in signal and the XOR signal to form an output signal 330. A not-OR (NOR) gate 320 NORs output signals 325 and 330 to form the sum signal.

Figure 4A:
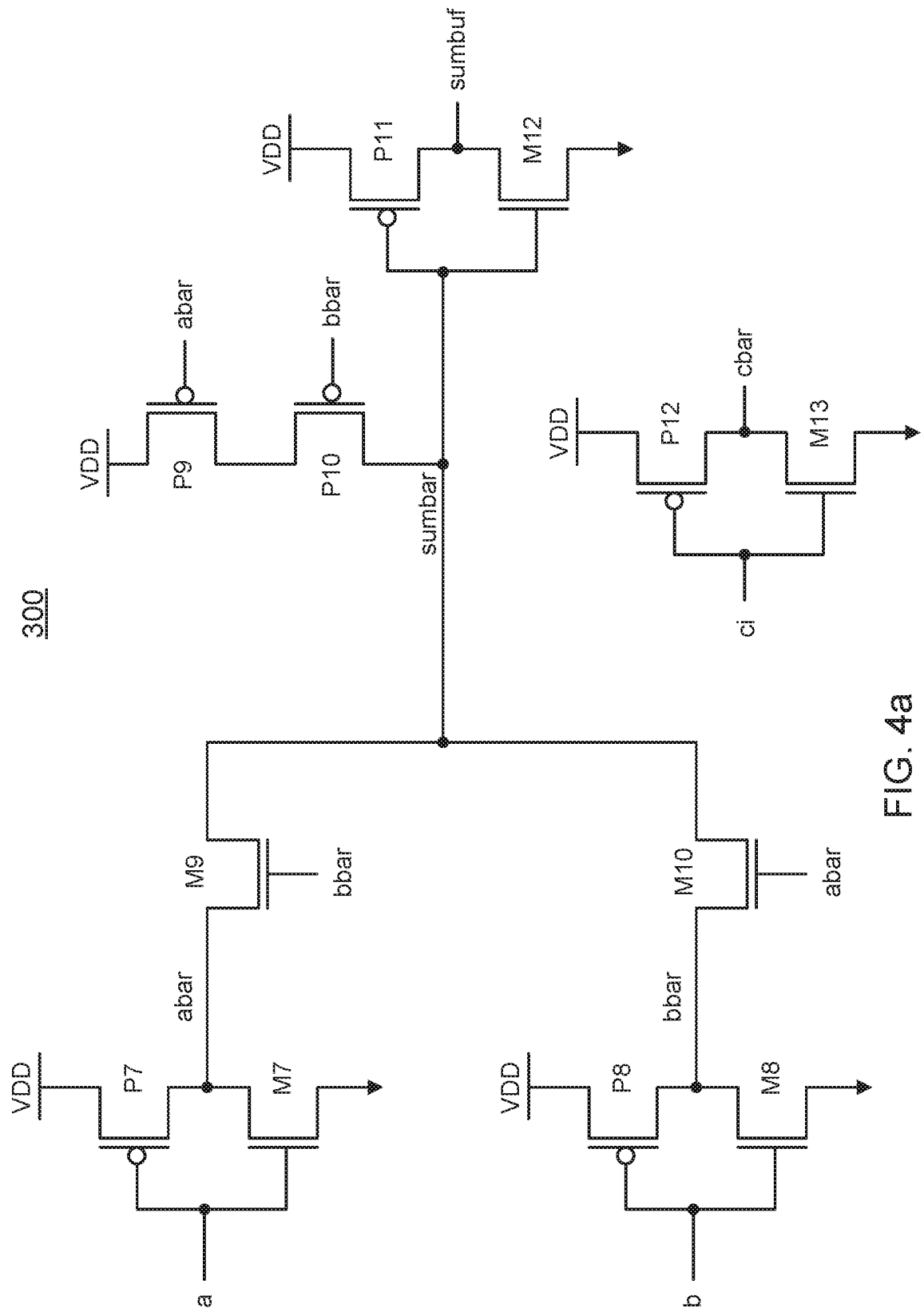
FIG. 4a and FIG. 4b form a circuit diagram of the sum logic circuit of FIG. 3 in accordance with an aspect of the disclosure.

The XNOR signal will be asserted high whenever the input signals a and b have the same binary state (are either both high or both low). For this reason, an XNOR function is also referred to as an equivalence function since it is asserted if the input signals have the same binary state. As discussed with regard to carry-out logic circuit 100, there are four binary combinations for the set of input signals for which the input signals a and b are either both high or both low. The sum signal then depends upon the state of the carry-in signal for these four possibilities such that the sum signal has the same binary state as the carry-in signal when input signals a and b are in equivalent binary states. Sum logic circuit 300 is shown in more detail in FIG. 4a and in FIG. 4b. As shown in FIG. 4a, an inverter formed by a serial combination of a PMOS transistor P7 and an NMOS transistor M7 inverts input signal a to form an inverted version (abar) of the input signal a. Similarly, an inverter formed by a PMOS transistor P8 in series with an NMOS transistor M8 inverts input signal b to form an inverted version (bbar) of the input signal b. If the input signal b is low, the bbar signal will thus be asserted high. This high state of the bbar signal switches on an NMOS transistor M9 that couples between the drains of transistors P7 and M7 and an XNOR node carrying the XNOR signal (designated as sumbar). The sumbar signal will thus be asserted high if both the input signals a and b are low because the abar signal will be asserted to charge the sumbar signal through the switched-on transistor M9. This satisfies the expected equivalence function of an XNOR operation when both the input signals a and b are low. Conversely, the sumbar signal will be discharged if the input signal a is asserted high while the input signal b is low as is expected for an XNOR operation.

If the input signal a is low, the abar signal is asserted high to switch on an NMOS transistor M10 that couples between the drains of transistors P8 and M8 and the node for the sumbar signal. Should the input signal b be asserted high while the input signal a is low, the sumbar signal will thus be discharged as is expected for an XNOR operation. To assert the sumbar signal when both input signals a and b are asserted high, the node for the sumbar signal couples to a power supply node through a serial combination of a PMOS transistor P9 and a PMOS transistor P10. The abar signal drives the gate of transistor P9 whereas the bbar signal drives the gate of transistor P10 although it will be appreciated that signal bbar could instead drive the gate of transistor P9 in alternative implementations. Transistors P9 and P10 are thus switched on when both input signals a and b are asserted high to charge the sumbar signal high as is expected for an XNOR operation. To form an XOR signal designated as sumbuf, the sumbar signal is inverted by an inverter formed by a serial combination of a PMOS transistor P11 and an NMOS transistor M12. As with the other inverters discussed herein, the source of transistor P11 is coupled to the power supply node whereas the source of transistor M12 is coupled to ground. Another inverter formed by a PMOS transistor P12 and an NMOS transistor M13 inverts the carry-in signal (ci) to form its inverse (cbar) signal.

Figure 4B:
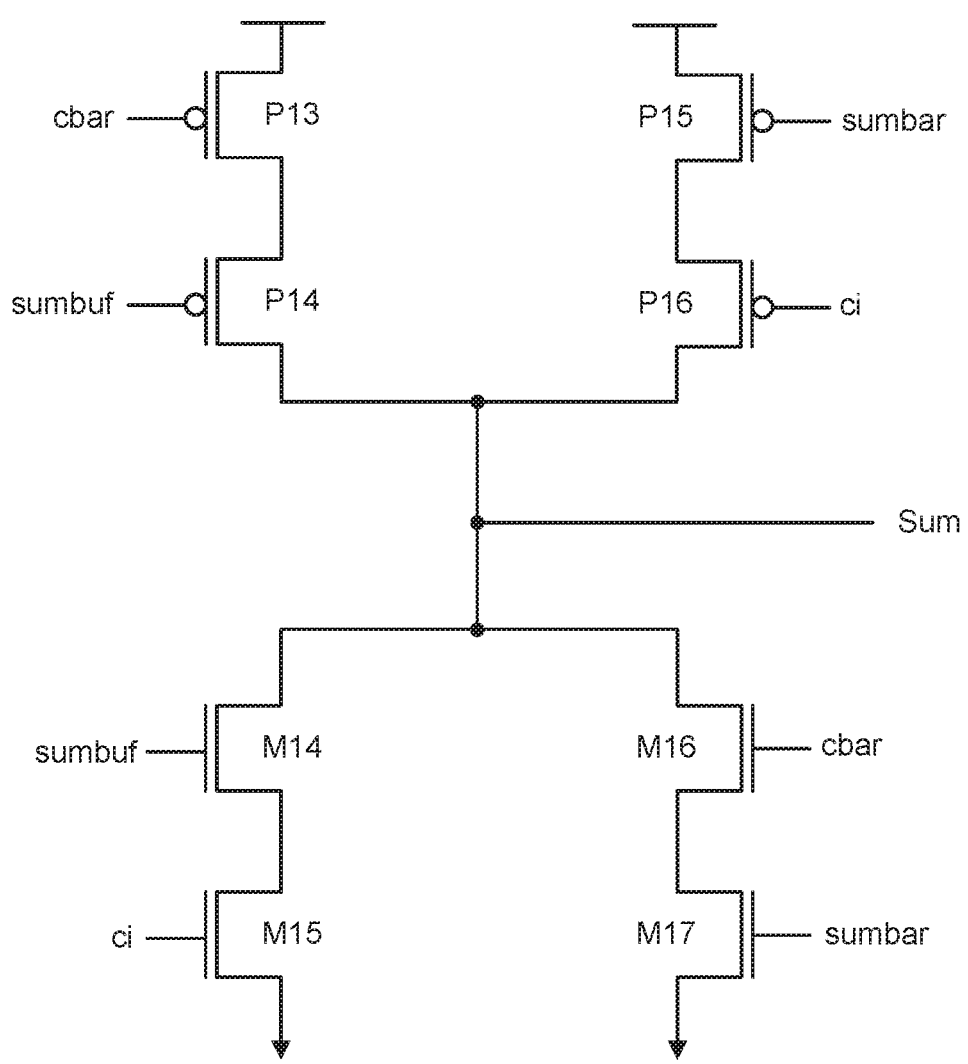

There are four possibilities or binary combinations for the set of input signals in which the XNOR of input signals a and b (as represented by the sumbar signal) is high. For these four possibilities, the sum signal has the same binary state as does the carry-in signal. For example, a node for producing the sum signal couples to the power supply node through a serial combination of a PMOS transistor P13 and a PMOS transistor P14 as shown in FIG. 4b. The sumbuf signal drives the gate of transistor P14 whereas the cbar signal drives the gate of transistor P13 (note that the signals may be switched so that the cbar signal drives the gate of transistor P14 in alternative implementations). Should the input signals a and b have the same binary state, the sumbuf signal is low so that transistor P14 is on. Transistor P13 will also be on if the carry-in signal is high. The sum signal will thus be charged high as is expected if the input signals a and b have the same binary state and the carry-in signal is also asserted.

To address the possibility that the input signals a and b both have the same binary state while the carry-in signal is low, the node for the sum signal couples to ground through a serial combination of an NMOS transistor M16 and an NMOS transistor M17. The cbar signal drives the gate of transistor M16 whereas the sumbar signal drives the gate of transistor M17. It will be appreciated that these signals may be switched in alternative implementations such that the sumbar signal would instead drive the gate of transistor M16. Should the input signals a and b both have the same binary state, transistor M17 will be switched on. If the carry-in signal is low, the cbar signal will be high to switch on transistor M16 so that the sum signal is discharged to satisfy the desired behavior.

There are also four possibilities in which the input signals a and b have complementary binary states such that the sumbar signal will be discharged and the sumbuf signal will be high. In that case, the sum signal will have the same binary state as the cbar signal. To enforce this desired behavior, the node for the sum signal couples to the power supply node through a serial combination of a PMOS transistor P15 and a PMOS transistor P16. The sumbar signal drives the gate of transistor P15 whereas the carry-in signal drives the gate of transistor P16. These signals may be switched in alternative implementations such that the sumbar signal would instead drive the gate of transistor P16. Should the input signals a and b have complementary binary states, the sumbar signal will be low so that transistor P15 is switched on. In that case, transistor P16 will also be switched on if the carry-in signal is low so that the sum signal is asserted high as expected. Conversely, the sum signal should be discharged if the carry-in signal is high and the sumbar signal is low. To enforce this desired behavior, the node for the sum signal couples to ground through a serial combination of an NMOS transistor M14 and an NMOS transistor M15. The sumbuf signal drives the gate of transistor M14 whereas the carry-in signal drives the gate of transistor M15. It will be appreciated these signals may be switched in alternative implementations such that the sumbuf signal would instead drive the gate of transistor M15. The sumbuf signal will be asserted high to switch on transistor M14 due to the complementary binary states for input signals a and b. In that case, transistor M15 will also be switched on if the carry-in signal is high to discharge the sum signal node. The sum signal will thus be discharged as is desired if the input signals a and b have complementary states and the carry-in signal is asserted. Note that in an alternative implementation, a lead (not illustrated) may connect between the sources of transistors P14 and P16.

Referring again to FIG. 4b, transistors P13 and P14 may be deemed to form a first switch configured to close responsive to the complement carry-in signal and the XOR signal being discharged. Similarly, transistors P15 and P16 may be deemed to form a second switch configured to close responsive to the XNOR signal and the carry-in signal both being discharged. Transistors M14 and M15 may be deemed to form a third switch configured to close responsive to the XOR signal and the carry-in signal both being asserted. Finally, transistors M16 and M17 may be deemed to form a fourth switch configured to close responsive to the complement carry-in signal and the XNOR signal both being asserted.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A sum logic circuit for a full adder for adding a first input signal, a second input signal, and a carry-in signal, the sum logic circuit comprising:
    an exclusive not-OR (XNOR) gate configured to XNOR the first input signal with the second input signal to form an XNOR signal;
    a first inverter configured to invert the XNOR signal to form an exclusive OR (XOR) signal;
    a second inverter configured to invert the carry-in signal to form a complement carry-in signal;
    a first AND gate configured to AND the complement carry-in signal and the XNOR signal to form a first AND signal;
    a second AND gate configured to AND the carry-in signal and the XOR signal to form a second AND signal; and
    a not-OR (NOR) gate configured to NOR the first AND signal and the second AND signal to form a sum signal.

2. A sum logic circuit for a full adder for adding a first input signal, a second input signal, and a carry-in signal to form a sum signal, the sum logic circuit comprising:
    an exclusive not-OR (XNOR) gate configured to XNOR the first input signal with the second input signal to form an XNOR signal;

a first inverter configured to invert the XNOR signal to form an exclusive OR (XOR) signal;

a second inverter configured to invert the carry-in signal to form a complement carry-in signal;

a plurality of logic gates configured to process the carry-in signal, the complement carry-in signal, the XNOR signal, and the XOR signal to produce a sum signal on a sum node;

the plurality of logic gates comprising a first switch coupled between the sum signal node and a power supply node for carrying a power supply voltage, wherein the first switch is configured to close responsive to the complement carry-in signal and the XOR signal both being discharged.

3. The sum logic circuit of claim 2, wherein the plurality of logic gates further comprises:

a second switch coupled between the sum signal node and the power supply node, wherein the second switch is configured to close responsive to the XNOR signal and the carry-in signal both being discharged.

4. The sum logic circuit of claim 3, wherein the first switch comprises:

a first p-type metal oxide semiconductor (PMOS) transistor; and a second PMOS transistor arranged in series with the first PMOS transistor to form a first series of PMOS transistors coupled between the sum signal node and the power supply node.

5. The sum logic circuit of claim 4, wherein the second switch comprises:

a third PMOS transistor arranged in series with a fourth PMOS transistor to form a second series of PMOS transistors coupled between the sum signal node and the power supply node.

6. The sum logic circuit of claim 3, wherein the plurality of logic gates further comprises:

a third switch coupled between the sum signal node and ground, wherein the third switch is configured to close responsive to the XOR signal and the carry-in signal both being charged to the power supply voltage.

7. The sum logic circuit of claim 6, wherein the plurality of logic gate further comprises:

a fourth switch coupled between the sum signal node and ground, wherein the fourth switch is configured to close responsive to the XNOR signal and the complement carry-in signal both being charged to the power supply voltage.

8. The sum logic circuit of claim 7, wherein the third switch comprises:

a first n-type metal oxide semiconductor (NMOS) transistor arranged in series with a second NMOS transistor to form a first series of NMOS transistors coupled between the sum signal node and ground.

9. The sum logic circuit of claim 8, wherein the fourth switch comprises:

a third NMOS transistor arranged in series with a fourth NMOS transistor to form a second series of NMOS transistors coupled between the sum signal node and ground.

10. The sum logic circuit of claim 1, further comprising a carry-out logic circuit for the full adder, wherein the carry-out logic circuit comprises a plurality of AND gates and a not-OR (NOR) gate.

11. A method for forming a sum signal for a full adder, comprising:

exclusive not-ORing (XNORing) a pair of input signals for the full adder in an XNOR gate to form an XNOR signal;

inverting the XNOR signal in an inverter to form an XOR signal;

ANDing the complement of the carry-in signal and the XNOR signal in a first AND gate to form a first AND output signal;

ANDing the carry-in signal and the XOR signal in a second AND gate to form a second AND output signal; and not-ORing the first AND output signal and the second AND output signal in a NOR gate to form the sum signal.

* * * * *